United States Patent
Chang et al.

(10) Patent No.: US 11,854,625 B2
(45) Date of Patent: Dec. 26, 2023

(54) DEVICE AND METHOD FOR OPERATING THE SAME

(71) Applicant: TAIWAN SEMICONDUCTOR MANUFACTURING COMPANY, LTD., Hsinchu (TW)

(72) Inventors: Kuo-Pin Chang, Hsinchu County (TW); Chien-Hung Liu, Hsinchu County (TW); Chih-Wei Hung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/191,892

(22) Filed: Mar. 4, 2021

(65) Prior Publication Data
US 2022/0284969 A1    Sep. 8, 2022

(51) Int. Cl.
*G11C 16/04*    (2006.01)
*G11C 16/24*    (2006.01)
*G11C 16/14*    (2006.01)

(52) U.S. Cl.
CPC .......... *G11C 16/24* (2013.01); *G11C 16/0425* (2013.01); *G11C 16/14* (2013.01)

(58) Field of Classification Search
CPC ...... G11C 16/24; G11C 16/0425; G11C 16/14
See application file for complete search history.

(56) References Cited

U.S. PATENT DOCUMENTS

| | | | | |
|---|---|---|---|---|
| 2004/0084716 A1* | 5/2004 | Hung | .................... | H01L 27/115 257/E27.103 |
| 2004/0084718 A1* | 5/2004 | Hung | .................. | H01L 29/7883 257/317 |
| 2006/0209585 A1* | 9/2006 | Tanizaki | .............. | G11C 13/004 365/148 |
| 2013/0051156 A1* | 2/2013 | Mina | ...................... | G11C 16/14 365/185.29 |
| 2013/0148409 A1* | 6/2013 | Chung | ................ | H01L 27/0924 257/4 |
| 2013/0343130 A1* | 12/2013 | Chen | ................... | G11C 16/0483 365/185.17 |
| 2014/0169105 A1* | 6/2014 | Oh | ....................... | H01L 29/7926 257/314 |
| 2014/0198570 A1* | 7/2014 | Hsieh | ................. | G11C 16/3459 365/185.03 |
| 2015/0092494 A1* | 4/2015 | Rhie | ....................... | G11C 16/16 365/185.11 |
| 2016/0329344 A1* | 11/2016 | Yeh | ................... | H01L 27/11524 |

* cited by examiner

*Primary Examiner* — Khamdan N. Alrobaie
(74) *Attorney, Agent, or Firm* — Birch, Stewart, Kolasch & Birch, LLP

(57) ABSTRACT

A device is disclosed herein. The device includes at least two transmit portions and at least one contact portion. Each of the at least two transmit portions is configured to receive a bit line signal. The at least one contact portion is couple to the at least two transmit portions respectively and configured to transmit the bit line signals from the least two transmit portions to a source line.

20 Claims, 8 Drawing Sheets

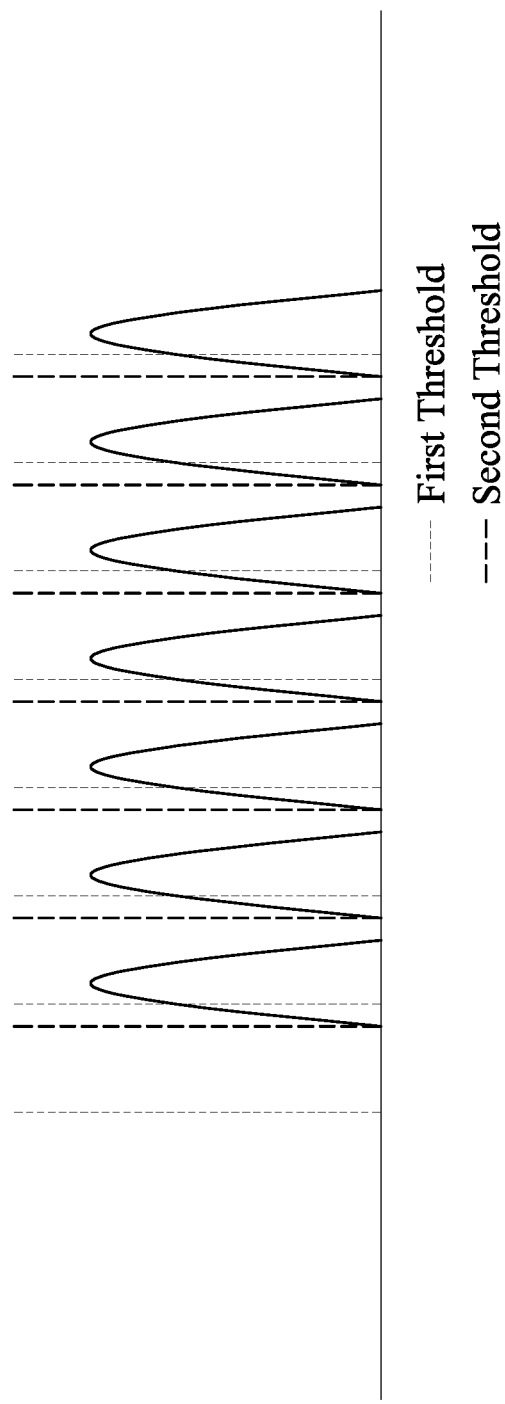

DEVICE AND METHOD FOR OPERATING THE SAME

BACKGROUND

A flash memory device includes a memory array having a large number of memory cells. Source line (SL) loadings of the flash memory device are worse due to high resistivity of oxide diffusion (OD). High SL loadings impact memory window of the flash memory and current distributions. SL loadings, especially in multi-levels operations or multi bit line sensing scheme, becomes an important role for product performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a wave form diagram, in accordance with various embodiments of the present disclosure.

DETAILED DESCRIPTION

Figure 1:
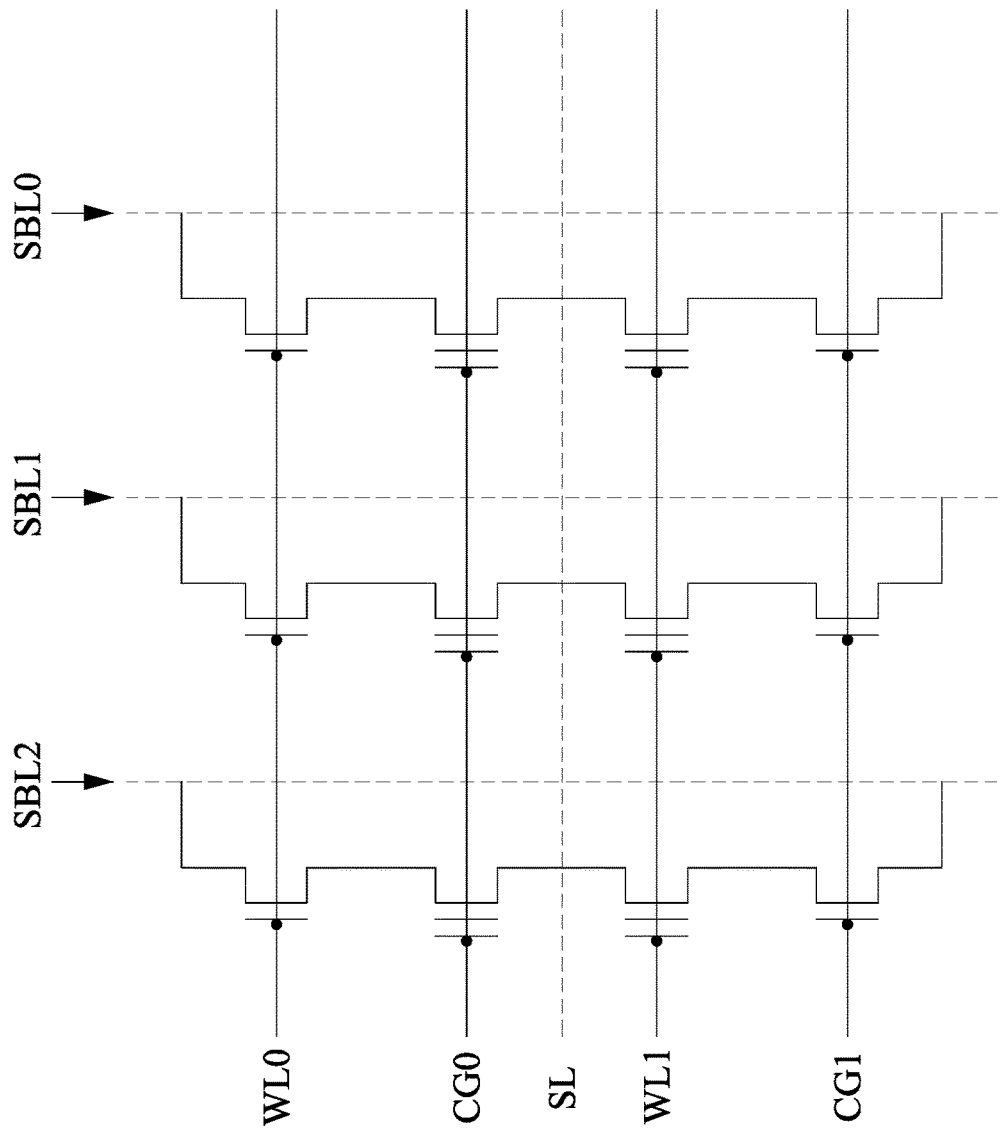
FIG. 1 is a schematic diagram of a device, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Reference is now made to FIG. 1. FIG. 1 is a schematic diagram of a device, in accordance with various embodiments of the present disclosure.

As illustratively shown in FIG. 1, the device includes a plurality of memory cells. Gate terminals of the memory cells are coupled to a word line WL0, a word line WL1, a control gate line CG0, and a control gate line CG1 respectively. The memory cells are coupled to each other in series to form a memory string, and there are plural of memory strings as shown in FIG. 1. A bit line signal SBL0, a bit line signal SBL1, and a bit line signal SBL2 are input into one terminal of one of the memory strings respectively. In some embodiments, the memory strings are coupled to a source line SL, which will be described in the following description in detail.

The terms "comprise," "comprising," "include," "including," "has," "having," etc. used in this specification are open-ended and mean "comprises but not limited." The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

The above discussion merely describes exemplary connections that can be made in accordance with various alternative embodiments. It is understood that such various alternative embodiments are not limited to the specific connections described above or those shown in FIG. 1.

In some embodiments, the device in FIG. 1 includes a flash memory. Flash memory can be formed on a bulk silicon substrate and uses various bias conditions to read and write data values. For example, an EFS3 cell—or "third generation SUPERFLASH" cell—includes a pair of symmetric split gate memory cells, each of which includes a pair of source/drain regions with a channel region arranged there between. In the EFS3 architecture, one of the source/drain regions for each of the split gate memory cells is a common source/drain region shared with its neighboring cell, while the other source/drain region is an individual source/drain unique to the cell. Within each split gate cell, a floating gate is arranged over the channel region of the cell, and a control gate is arranged over the floating gate. A select gate is arranged on one side of the floating and control gates (e.g., between an individual source/drain region of the EFS3 cell and a sidewall of the floating and/or control gate). At least one memory cell is configured to store a variable charge level on its floating gate, wherein the level of this charge corresponds to a data state stored in the cell and is stored in a non-volatile manner so that the stored charge/data persists in the absence of power.

In some embodiments, flash memory cells can be electronically programmed and erased in memory arrays. Programming operation of these memory arrays includes charging a floating gate of a selected memory cell by applying suitable voltages to a select gate and a control gate of the selected memory cell. For example, a select gate decoder provides an on-signal to the select gate of the selected memory cell and off-signals to select gates of non-selected memory cells. In some cases, for saving chip spaces, a control gate decoder provides the same signal to the control gates of all memory cells. Since the control gates of the non-selected memory cells are provided with the same signal as that of the selected memory cell, the programming operation might be performed with undesired program disturb, which is the partial charging of the floating gates of non-selected memory cells. It is important that cells which are not selected for the programming cycle are not disturbed by the programming of the selected cell. In some cases, control gates of neighboring memory cells are controlled by different control gates.

Figure 2:
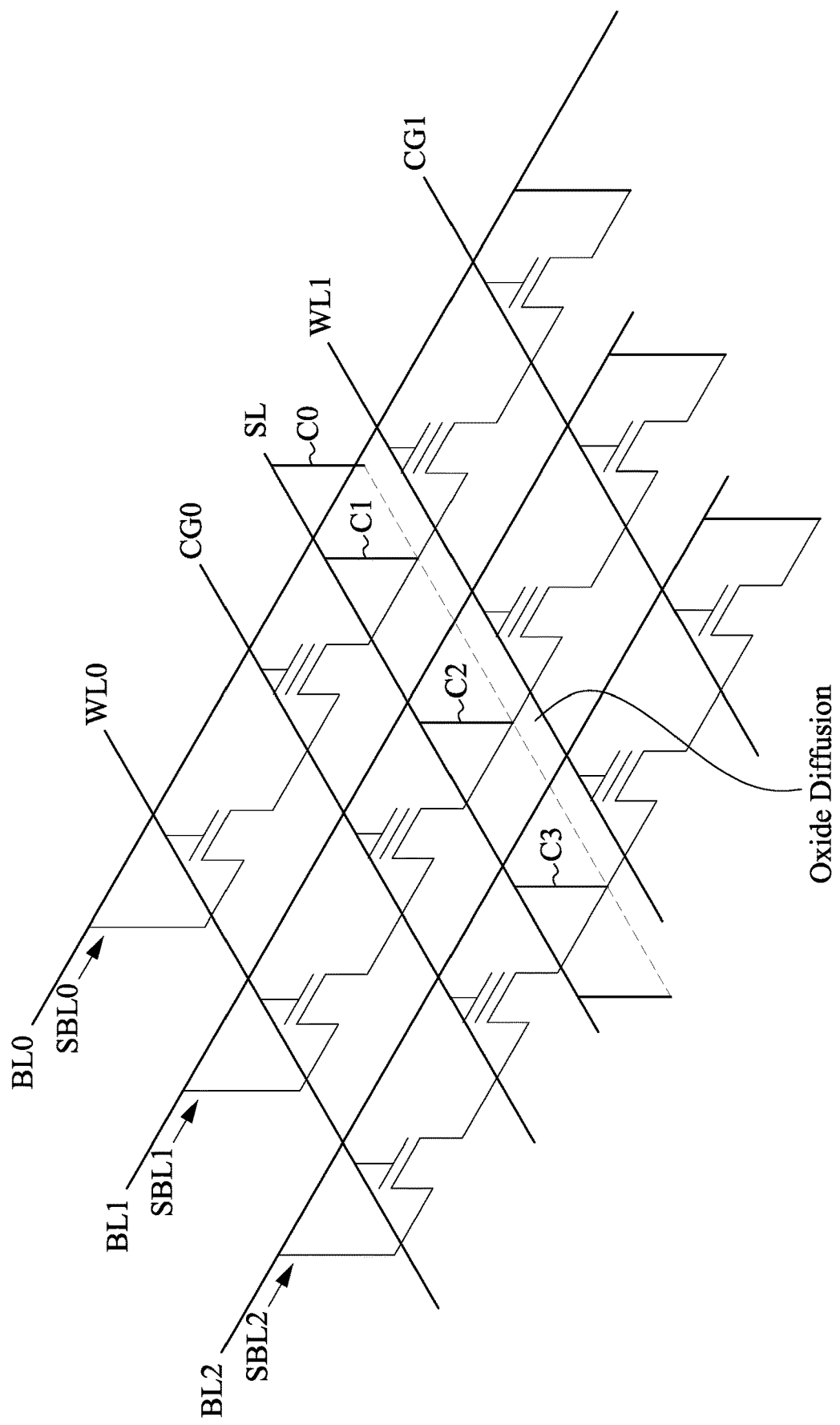
FIG. 2 is a lateral view of the device as shown in FIG. 1, in accordance with various embodiments of the present disclosure.

Reference is now made to FIG. 2. FIG. 2 is a lateral view of the device as shown in FIG. 1, in accordance with various embodiments of the present disclosure.

As illustratively shown in FIG. 2, the device also includes a plurality of memory cells, which are coupled to each other in series, such that a plurality of memory strings are formed. The gate terminals of the memory cells are also coupled to the word line WL0, the word line WL1, the control gate line CG0, and the control gate line CG1 respectively. Compared with the device in FIG. 1, it is noted that the device in FIG. 2 further includes a bit line BL0, a bit line BL1, and a bit line BL2. The bit line BL0, the bit line BL1, and the bit line BL2 are coupled to one terminal of one of the memory strings respectively. The bit line BL0, the bit line BL1, and the bit line BL2 transmit the bit line signal SBL0, the bit line signal SBL1, and the bit line signal SBL2 to one terminal of one of the memory strings correspondingly.

In some embodiments, compared with the device in FIG. 1, it is noted that the device in FIG. 2 further includes a contact portion C1, a contact portion C2, and a contact portion C3. As illustratively shown in FIG. 2, the contact portion C1, the contact portion C2, and the contact portion C3 are coupled to one of the memory strings respectively. Furthermore, the contact portion C1, the contact portion C2, and the contact portion C3 are coupled to the source line SL. In some embodiments, after the bit line BL0, the bit line BL1, and the bit line BL2 transmit the bit line signal SBL0, the bit line signal SBL1, and the bit line signal SBL2 into one terminal of one of the memory strings respectively, the bit line signal SBL0, the bit line signal SBL1, and the bit line signal SBL2 flow from the memory strings to the contact portion C1, the contact portion C2, and the contact portion C3. For example, after the bit line BL0 transmits the bit line signal SBL0 into one terminal of the memory string, the bit line signal SBL0 flows from the memory string to the contact portion C1. After the bit line BL1 transmits the bit line signal SBL1 into one terminal of the memory string, the bit line signal SBL1 flows from the memory string to the contact portion C2. In addition, after the bit line BL2 transmits the bit line signal SBL2 into one terminal of the memory string, the bit line signal SBL2 flows from the memory string to the contact portion C3.

Substantially, the bit line signal SBL0, the bit line signal SBL1, and the bit line signal SBL2 flow from the contact portion C1, the contact portion C2, and the contact portion C3 to the source line SL. Next, the bit line signal SBL0, the bit line signal SBL1, and the bit line signal SBL2 flow from the source line SL to a source line driver (the source line driver will be shown in the following FIG. 3).

In some cases, the device as shown in FIG. 2 does not have the contact portion C1, the contact portion C2, and the contact portion C3. Accordingly, the bit line signal SBL0, the bit line signal SBL1, and the bit line signal SBL2 cannot flow from the contact portion C1, the contact portion C2, and the contact portion C3 to the source line SL. In such condition, the bit line signal SBL0, the bit line signal SBL1, and the bit line signal SBL2 shall flow through the oxide diffusion as shown in FIG. 2 to a common contact portion C0, and then the bit line signal SBL0, the bit line signal SBL1, and the bit line signal SBL2 flow from the common contact portion C0 to the source line SL. Since the resistance of the oxide diffusion is high and distances of the oxide diffusion, which the bit line signal SBL0, the bit line signal SBL1, and the bit line signal SBL2 pass, are different, the bit line signal SBL0, the bit line signal SBL1, and the bit line signal SBL2 perform different source line (SL) loadings. Specifically, if the bit line signal SBL0, the bit line signal SBL1, and the bit line signal SBL2 want to converge on the contact portion C0, the bit line signal SBL2 shall pass through a long distance in the oxide diffusion. In contrast to that, the bit line signal SBL0 shall pass through a short distance in the oxide diffusion. Hence, the performance of the memory will be affected due to the different SL loadings.

As illustratively shown in FIG. 2, since each of the bit line signal SBL0, the bit line signal SBL1, and the bit line signal SBL2 flows into the source line SL through one of the corresponding contact portions C1, C2, C3, the bit line signal SBL0, the bit line signal SBL1, and the bit line signal SBL2 do not have to pass the transmit portion as shown in FIG. 2 to converge on the source line SL, such that the source line loading to each of the bit line signal SBL0, the bit line signal SBL1, and the bit line signal SBL2 are substantially the same. Specifically, the bit line signal SBL0 flows into the source line SL through the contact portion C1, the bit line signal SBL1 flows into the source line SL through the contact portion C2, and the bit line signal SBL2 flows into the source line SL through the contact portion C3. Therefore, the bit line signal SBL0, the bit line signal SBL1, and the bit line signal SBL2 do not have to pass the transmit portion as shown in FIG. 2 to converge on the source line SL through the common contact portion C0. Since each of the bit line signal SBL0, the bit line signal SBL1, and the bit line signal SBL2 flows from one of the bit line BL0, the bit line BL1, and the bit line BL2 to the source line driver through one of the contact portion C1, the contact portion C2, and the contact portion C3 and the source line SL, the resistances between the bit lines BL0, BL1, BL2 and the source line driver are substantially the same. Hence, the source line loading to each of the bit line signal SBL0, the bit line signal SBL1, and the bit line signal SBL2 are substantially the same.

The above discussion merely describes exemplary connections that can be made in accordance with various alternative embodiments. It is understood that such various alternative embodiments are not limited to the specific connections described above or those shown in FIG. 2.

Figure 3:
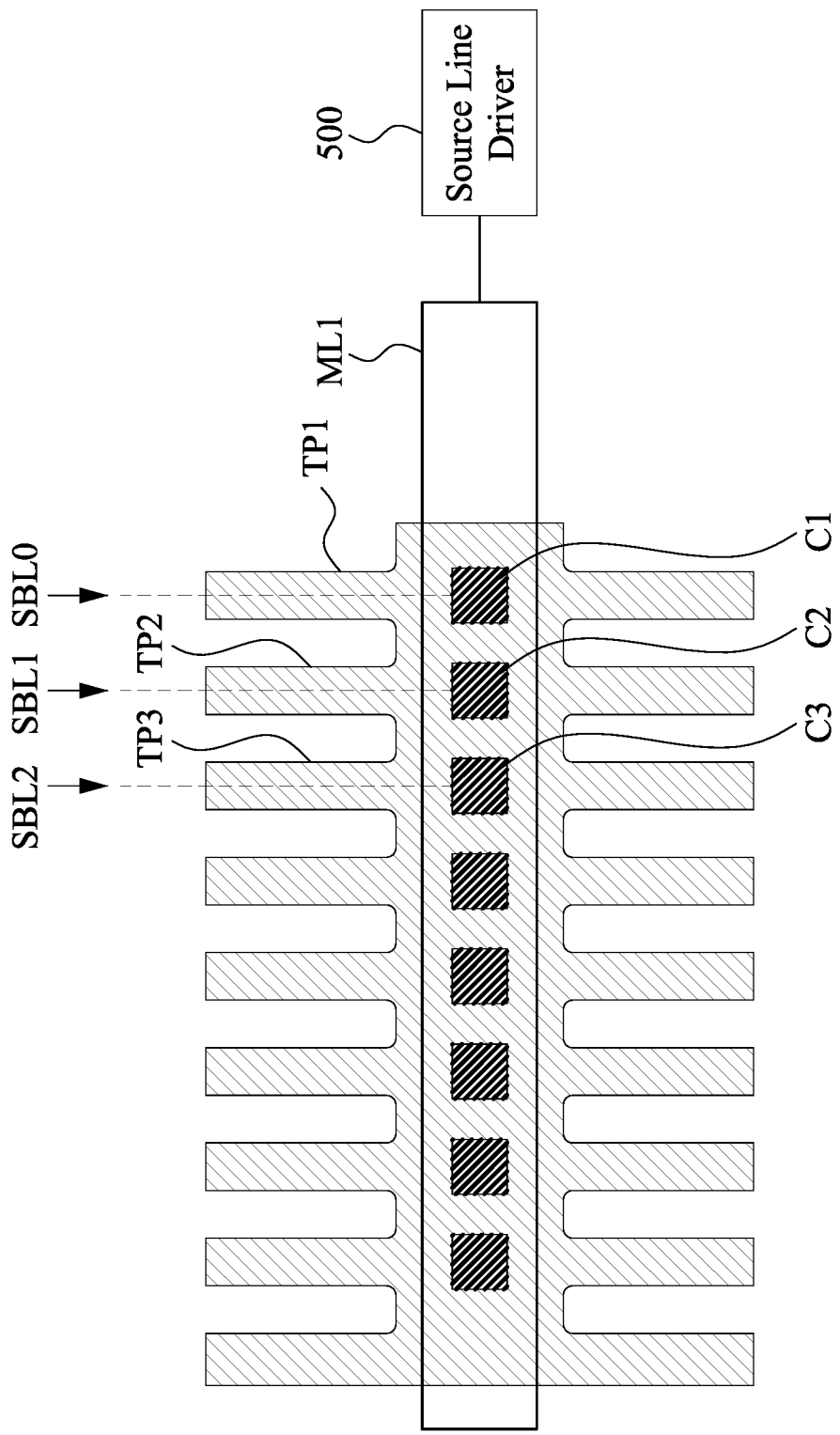
FIG. 3 is a structure diagram of the device as shown in FIG. 1 and FIG. 2, in accordance with various embodiments of the present disclosure.

Reference is now made to FIG. 3. FIG. 3 is a structure diagram of the device as shown in FIG. 1 and FIG. 2, in accordance with various embodiments of the present disclosure.

As illustratively shown in FIG. 3, it illustrates a top view of the device as shown in FIG. 1 and FIG. 2. The device includes at least two transmit portions, for example, a transmit portion TP1, a transmit portion TP2. Furthermore, the device includes at least one contact portion, for example, a contact portion C1. The contact portion, for example, the contact portion C1, is couple to the transmit portion, for example, the transmit portion TP1.

Referring to both FIG. 2 and FIG. 3, after the bit line BL0 transmits the bit line signal SBL0 into one terminal of the memory cell string, the bit line signal SBL0 flows through the transmit portion TP1 of the memory cell string to the contact portion C1. In other words, the transmit portion TP1 of the memory cell string receives the bit line signal SBL0 from the bit line BL0. Substantially, the contact portion C1 transmits the bit line signal SBL0 from the transmit portion TP1 to the source line driver 500 through a metal layer ML1.

Reference is now made to both FIG. 2 and FIG. 3. In some embodiments, the device includes at least two contact portions, for example, the contact portion C1, and the contact portion C2. One of the contact portions, for example, the contact portion C1, is coupled to one of the transmit portions, for example, the transmit portion TP1. Another one of the contact portions, for example, the contact portion C2, is coupled to another one of the transmit portions, for example, the transmit portion TP2. The contact portion C1 and the contact portion C2 are coupled to the metal layer ML1, and the metal layer ML1 is coupled to the source line driver 500.

In some embodiments, resistances between the at least two transmit portions and the source line driver are substantially the same. For example, the transmit portion TP1 is coupled to the source line driver 500 through the contact portion C1 and the metal layer ML1, and the transmit portion TP2 is coupled to the source line driver 500 through the contact portion C2 and the metal layer ML1. Therefore, the resistance between the transmit portion TP1 and the source line driver 500 and the resistance between the transmit portion TP2 and the source line driver 500 are substantially the same. It is noted that "the resistance between the transmit portion TP1 and the source line driver 500 and the resistance between the transmit portion TP2 and the source line driver 500 are substantially the same" means that the difference between the resistances is less than 20% of the greater/smaller resistance value.

Owing to resistances between the at least two transmit portions and the source line driver are substantially the same, the bit line BL0 and the bit line BL1 perform the same SL loading. Specifically, the bit line BL0 and the bit line BL1 input the bit line signal SBL0 and the bit line signal SBL1 to the transmit portion TP1 and the transmit portion TP2, and the bit line signal SBL0 and the bit line signal SBL1 are transmitted to the source line driver 500 through the contact portion C1, the contact portion C2 and the metal layer ML1. If the resistance between the transmit portion TP1 and the source line driver 500 and the resistance between the transmit portion TP2 and the source line driver 500 are substantially the same, the bit line BL0 and the bit line BL1 perform the same SL loading.

In some embodiments, one of the contact portions is coupled to one of the transmit portions in a one-on-one manner. For example, the contact portion C1 is couple to the transmit portion TP1, the contact portion C2 is couple to the transmit portion TP2, and the contact portion C3 is couple to the transmit portion TP3.

In some embodiments, the transmit portions are disposed on the same layer. For example, the transmit portion T1, the transmit portion T2 and the transmit portion T3 are disposed on the same layer.

In some embodiments, the contact portions are disposed on a same layer. For example, the contact portion C1, the contact portion C2 and the contact portion C3 are disposed on the same layer.

The above discussion merely describes exemplary connections that can be made in accordance with various alternative embodiments. It is understood that such various alternative embodiments are not limited to the specific connections described above or those shown in FIG. 3.

Figure 4:
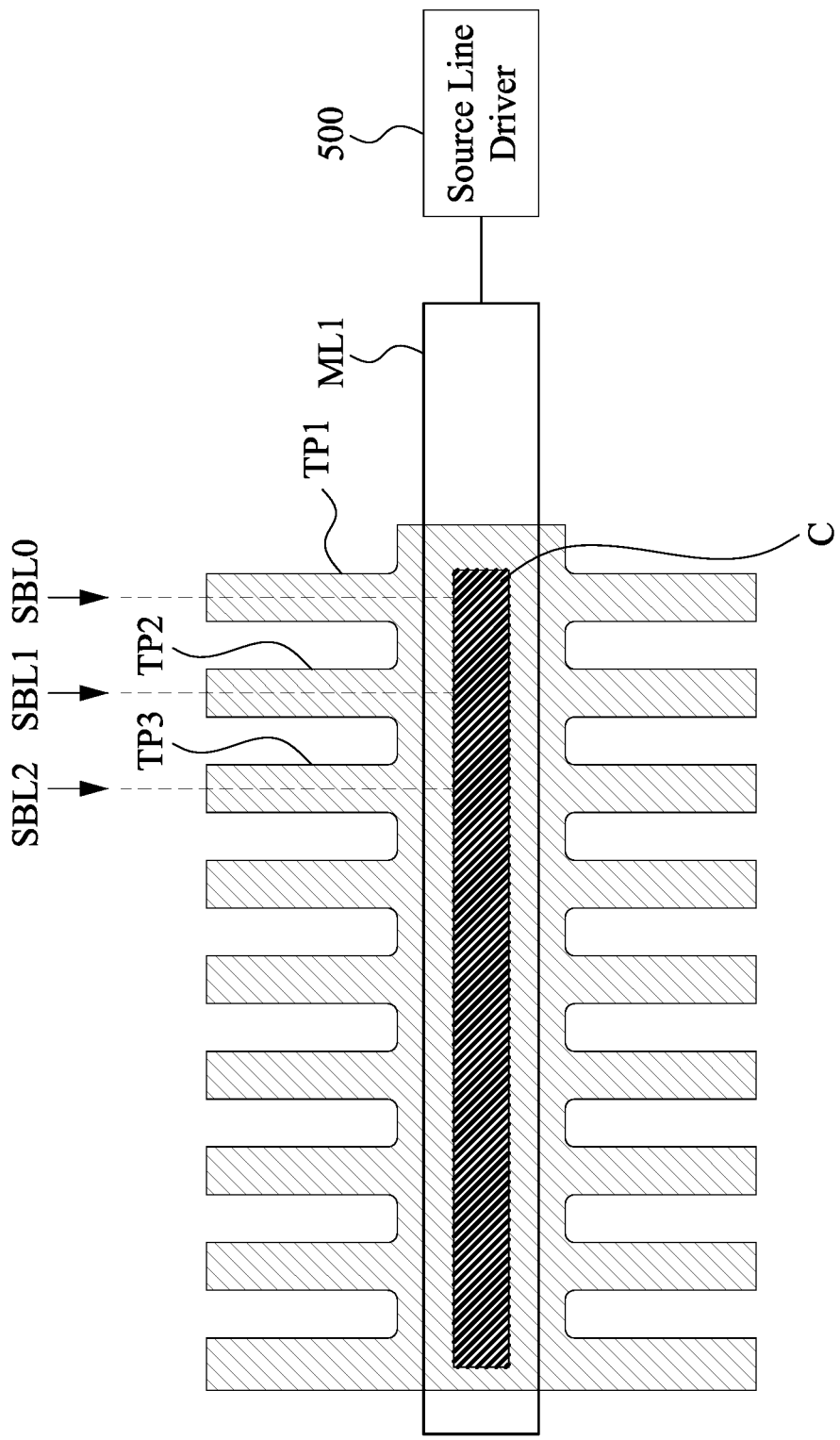
FIG. 4 is a structure diagram of the device as shown in FIG. 1 and FIG. 2, in accordance with various embodiments of the present disclosure.

Reference is now made to FIG. 4. FIG. 4 is a structure diagram of the device as shown in FIG. 1 and FIG. 2, in accordance with various embodiments of the present disclosure.

As illustratively shown in FIG. 4, it illustrates a top view of the device as shown in FIG. 1 and FIG. 2. The device includes a plurality of transmit portions, for example, a transmit portion TP1, a transmit portion TP2, a transmit portion TP3. Furthermore, the device includes only one contact portion, for example, a contact portion C. The contact portion, for example, the contact portion C1, is couple to the transmit portions, for example, the transmit portion TP1, the transmit portion TP2, and the transmit portion TP3.

Referring to both FIG. 2, FIG. 4, after the bit line BL0, the bit line BL1 and the bit line BL2 transmit the bit line signal SBL0, the bit line signal SBL1 and the bit line signal SBL2 into one terminal of the memory cell strings respectively, the bit line signal SBL0, the bit line signal SBL1 and the bit line signal SBL2 flow through the transmit portion TP1, the transmit portion TP2 and the transmit portion TP3 to the contact portion C. In other words, the transmit portion TP1, the transmit portion TP2 and the transmit portion TP3 receive the bit line signal SBL0, the bit line signal SBL1 and the bit line signal SBL2 from the bit line BL0, the bit line BL1 and the bit line BL2. Substantially, the contact portion C transmits the bit line signal SBL0, the bit line signal SBL1 and the bit line signal SBL2 from the transmit portion TP1, the transmit portion TP2 and the transmit portion TP3 to the source line driver 500 through the metal layer ML1.

In some embodiments, resistances between the plural transmit portions and the source line driver are substantially the same. For example, the transmit portion TP1 is coupled to the source line driver 500 through the contact portion C and the metal layer ML1, the transmit portion TP2 is coupled to the source line driver 500 through the contact portion C and the metal layer ML1, and the transmit portion TP3 is coupled to the source line driver 500 through the contact portion C and the metal layer ML1. Therefore, the resistance between the transmit portion TP1 and the source line driver 500, the resistance between the transmit portion TP2 and the source line driver 500, and the resistance between the transmit portion TP3 and the source line driver 500 are substantially the same. It is noted that "the resistances between the transmit portions TP1, TP2, TP3 and the source line driver 500 are substantially the same" means that the difference between the resistances is less than 20% of the greater/smaller resistance value.

Owing to resistances between the plural transmit portions and the source line driver are substantially the same, the bit line BL0, the bit line BL1 and the bit line BL2 perform the same SL loading. Specifically, the bit line BL0, the bit line BL1 and the bit line BL2 input the bit line signal SBL0, the bit line signal SBL1 and the bit line signal SBL2 to the transmit portion TP1, the transmit portion TP2 and the transmit portion TP3, and the bit line signal SBL0, the bit line signal SBL1 and the bit line signal SBL2 are transmitted to the source line driver 500 through the contact portion C and the metal layer ML1. If the resistances between the transmit portions TP1, TP2, TP3 and the source line driver 500 are substantially the same, the bit line BL0, the bit line BL1 and the bit line BL2 perform the same SL loading.

The above discussion merely describes exemplary connections that can be made in accordance with various alternative embodiments. It is understood that such various alternative embodiments are not limited to the specific connections described above or those shown in FIG. 4.

Figure 5:
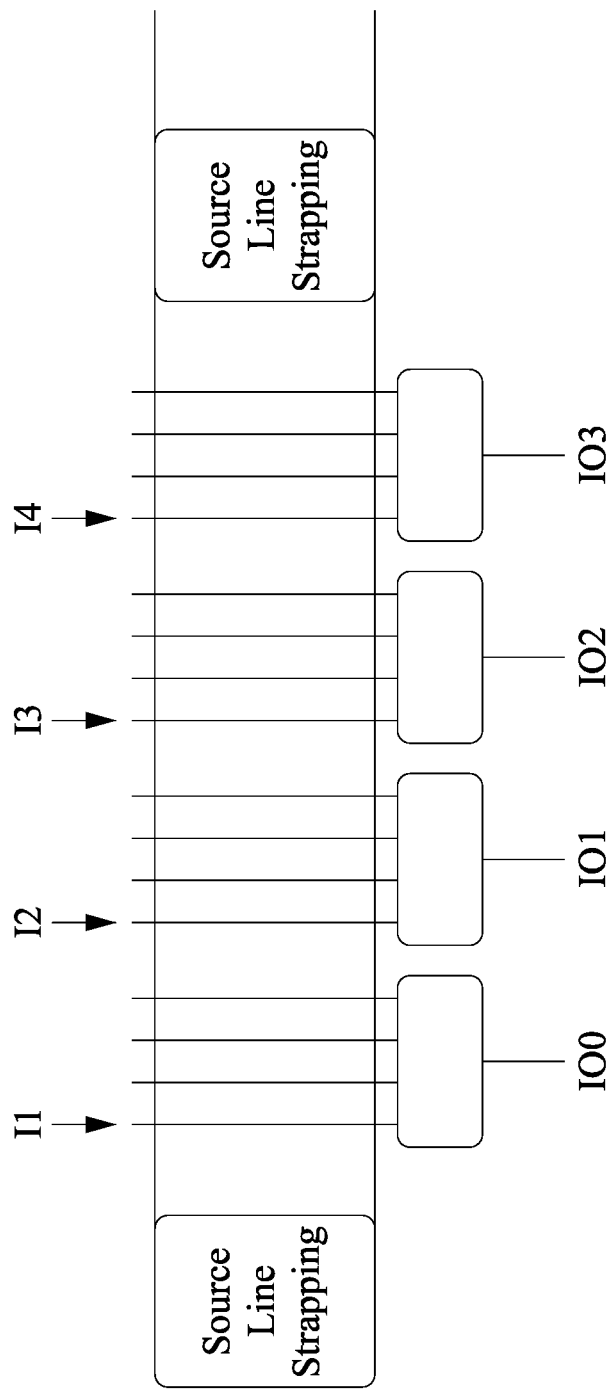
FIG. 5 is a schematic diagram of a device, in accordance with various embodiments of the present disclosure.

FIG. 5 is a schematic diagram of a device, in accordance with various embodiments of the present disclosure.

As illustratively shown in FIG. 5, a device includes a plurality of input/output (IO) buffers IO0, IO1, IO2, IO3. Each of the IO buffers IO0, IO1, IO2, IO3 is coupled to four bit lines.

In some embodiments, the device can be a memory. When a read operation is performed to the device, the buffers IO0, IO1, IO2, IO3 of the device can select one of the bit lines for reading. When a program operation is performed to the device, the bit lines will be programed sequentially.

Figure 6:
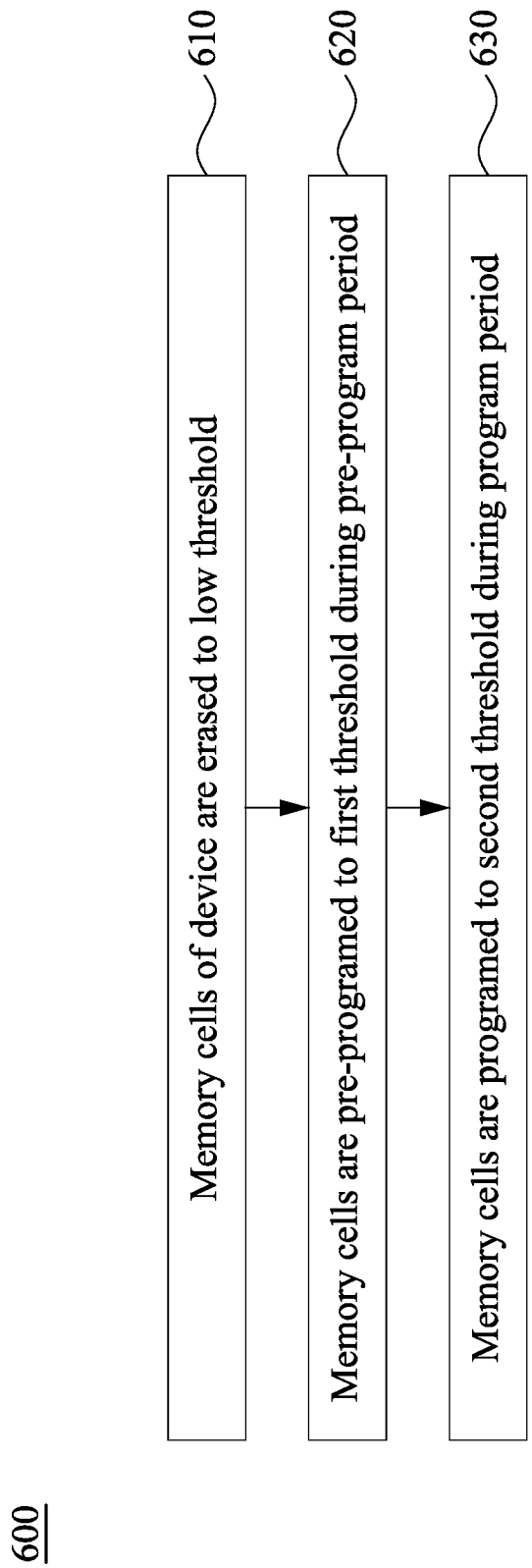
FIG. 6 is a flow chart of a method for operating the device as shown in FIG. 5 in accordance with some embodiments of the present disclosure.

Reference is now made to FIG. 6. FIG. 6 is a flow diagram of a method for operating the device as shown in FIG. 5 according to some embodiments of the present disclosure.

With reference to the method 600 in FIG. 6, in operation 610, the memory cells of the device are erased to a low threshold. In some embodiments, after the memory cells of the device are erased, the SL bias is VS1.

In operation 620, the memory cells are pre-programed to a first threshold during a pre-program period.

Figure 7:
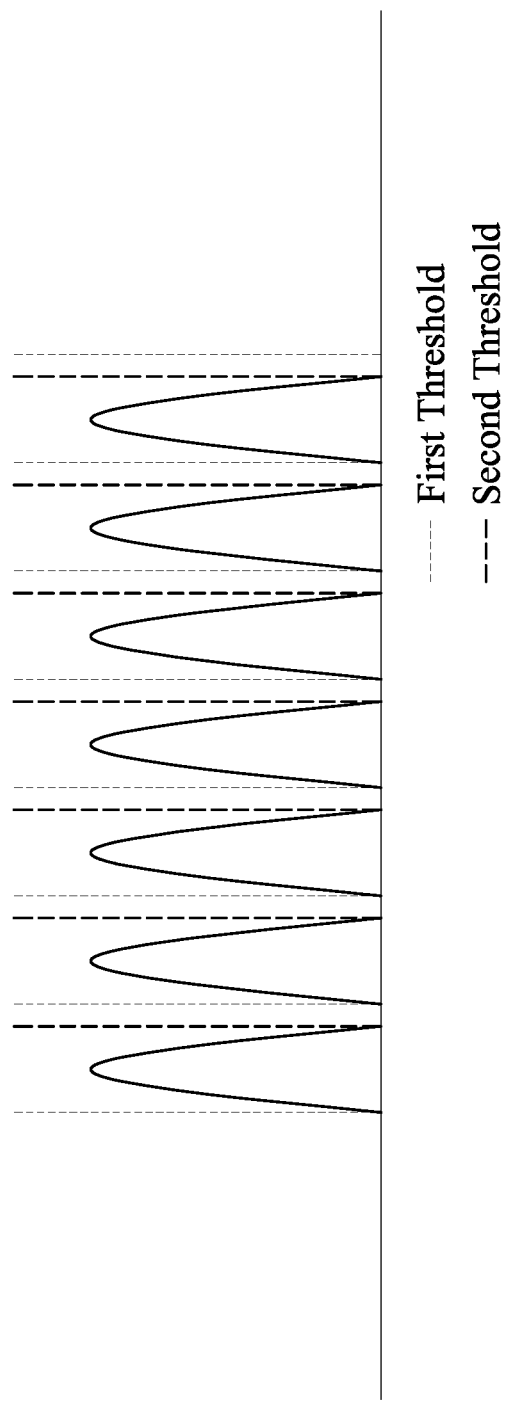
FIG. 7 is a wave form diagram, in accordance with various embodiments of the present disclosure.

In some embodiments, reference is now made to the method 600 in FIG. 6 together with the wave form in FIG. 7, which is a wave form diagram, in accordance with various embodiments of the present disclosure. As illustratively shown in FIG. 7, the memory cells are pre-programed to the first threshold during the pre-program period. After the memory cells of the device are pre-programed, the SL bias is VS2.

In operation 630, the memory cells are programed to a second threshold during a program period.

In some embodiments, reference is now made to the method 600 in FIG. 6 together with the wave form in FIG. 8, which is a wave form diagram, in accordance with various embodiments of the present disclosure. As illustratively shown in FIG. 8, the memory cells are programed to the second threshold during the program period. After the memory cells of the device are programed, the SL bias is VS3. In some embodiments, the second threshold is a program verify (PV) level.

In some embodiments, the first threshold and the second threshold are larger than the low threshold. In some embodiments, the second threshold is larger than the first threshold.

In some embodiments, a difference between the first threshold and the low threshold is larger than a difference between the second threshold and the first threshold. In some embodiments, the second threshold is near the first threshold.

During the program operation, when all the memory cells are programed to the target level, the SL bias for the IO buffer IO0 will have a large offset, which will be described as follow. Firstly, when the memory cells corresponding to the IO buffer IO0 are designed to a current I1, the SL bias for the IO buffer IO0 is VS2. When all memory cells corresponding to the IO buffer IO0, IO1, IO2, IO3 are designed to currents I1, I2, I3, I4 respectively, the SL bias for the IO buffer IO0 is VS3. In some cases, the VS3 is much larger than VS2, and the offset of the SL bias for the IO buffer IO0 is huge.

Therefore, the operation 620 is performed to pre-program all of the memory cells to a first threshold. Subsequently, the operation 630 is performed to program all of the memory cells to a second threshold. In such cases, the SL bias for the IO buffer IO0 is VS2 after pre-program operation, the SL bias for the IO buffer IO0 is VS3 after program operation, and difference of the VS2 and the VS3 is minor. Hence, the offset of the SL bias for the IO buffer IO0 is reduced.

Also disclosed is a device. The device includes at least two transmit portions and at least one contact portion. Each of the at least two transmit portions is configured to receive a bit line signal. The at least one contact portion is couple to the at least two transmit portions respectively and configured to transmit the bit line signals from the least two transmit portions to a source line.

In some embodiments, the at least one contact portion comprises at least two contact portions, wherein one of the at least two contact portions is coupled to one of the at least two transmit portions, and another one of the at least two contact portions is coupled to another one of the at least two transmit portions.

In various embodiments, the source line is coupled to a source line driver.

In some embodiments, resistances between the at least two transmit portions and the source line driver are substantially the same.

In various embodiments, the at least two transmit portions comprise a first transmit portion and a second transmit portion. The first transmit portion is configured to receive a first bit line signal. The second transmit portion is configured to receive a second bit line signal.

In some embodiments, the at least two contact portions comprise a first contact portion and a second contact portion. The first contact portion is coupled to the first transmit portion and configured to transmit the first bit line signal from the first transmit portion to the source line. The second contact portion is coupled to the second transmit portion and configured to transmit the second bit line signal from the second transmit portion to the source line.

In various embodiments, a first resistance between the first transmit portion and the source line driver is substantially the same as a second resistance between the second transmit portion and the source line driver.

Also disclosed is a device that includes a plurality of transmit portions and a plurality of transmit portions. Each of the plurality of transmit portions is configured to receive a bit line signal. Each of the plurality of contact portions is coupled to one of the plurality of transmit portions, wherein the plurality of contact portions are configured to transmit the bit line signals from the plurality of transmit portions to a source line.

In some embodiments, one of the plurality of contact portions is coupled to one of the plurality of transmit portions in a one-on-one manner.

In various embodiments, the source line is coupled to a source line driver.

In some embodiments, resistances between the plurality of transmit portions and the source line driver are substantially the same.

In various embodiments, the plurality of transmit portions are disposed on a same layer.

In some embodiments, the plurality of contact portions are disposed on a same layer.

Also disclosed is a method that includes the operations below: erasing memory cells to a low threshold; pre-programing the memory cells to a first threshold during a pre-program period; and programing the memory cells to a second threshold during a program period.

In some embodiments, a difference between the first threshold and the low threshold is larger than a difference between the second threshold and the first threshold.

In some embodiments, the second threshold comprises a program verify.

In some embodiments, the first threshold is larger than the low threshold.

In some embodiments, the second threshold is larger than the low threshold.

In some embodiments, the second threshold is near the first threshold.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   at least two transmit portions, the at least two transmit portions being configured to receive bit line signals;
   at least two contact portions coupled to the at least two transmit portions respectively, wherein the at least two contact portions are separated from each other; and
   a source line coupled to the at least two transmit portions through the at least two contact portions;
   wherein the at least two contact portions are configured to transmit the bit line signals from the at least two transmit portions to the source line,
   wherein a first transmit portion in the at least two transmit portions is electrically coupled between two adjacent memory cells in a memory string and is further coupled to the source line through a first contact portion, arranged between the two adjacent memory cells, of the at least two contact portions.

2. The device of claim 1, wherein a second contact portion of the at least two contact portions is coupled to a second transmit portion of the at least two transmit portions.

3. The device of claim 2, wherein the source line is coupled to a source line driver.

4. The device of claim 3, wherein resistances between the at least two transmit portions and the source line driver are substantially the same.

5. The device of claim 4, wherein
   the first transmit portion is configured to receive a first bit line signal, and
   the second transmit portion is configured to receive a second bit line signal.

6. The device of claim 5, wherein the at least two contact portions comprise:
   the first contact portion is configured to transmit the first bit line signal from the first transmit portion to the source line, and
   the second contact portion is configured to transmit the second bit line signal from the second transmit portion to the source line.

7. The device of claim 6, wherein a first resistance between the first transmit portion and the source line driver is substantially the same as a second resistance between the second transmit portion and the source line driver.

8. A device, comprising:
   a plurality of transmit portions, the plurality of transmit portions being configured to receive bit line signals that are transmitted through a plurality of memory strings separately, wherein each of the plurality of memory string comprises memory cells coupled in series;
   a plurality of contact portions, wherein each of the plurality of contact portions is coupled to one of the plurality of transmit portions, disposed at a center of a corresponding string in of the plurality of memory strings, and arranged between two adjacent memory cells in the corresponding string; and
   a source line coupled to the plurality of transmit portions through the plurality of contact portions;
   wherein the plurality of contact portions are configured to transmit the bit line signals from the plurality of transmit portions to the source line;
   wherein, in a layout view, the plurality of transmit portions are separated along a first direction, and the plurality of contact portions are separated along the first direction.

9. The device of claim 8, wherein one of the plurality of contact portions is coupled to one of the plurality of transmit portions in a one-on-one manner.

10. The device of claim 9, wherein the source line is coupled to a source line driver.

11. The device of claim 10, wherein resistances between the plurality of transmit portions and the source line driver are substantially the same.

12. The device of claim 11, wherein the plurality of transmit portions are disposed on a same layer.

13. The device of claim 12, wherein the plurality of contact portions are disposed on a same layer.

14. A device, comprising:
   a plurality of transmit portions, the plurality of transmit portions being configured to receive bit line signals;
   a plurality of contact portions, each of the plurality of contact portions being coupled to one of the plurality of transmit portions, wherein the plurality of contact portions are configured to transmit the bit line signals from the plurality of transmit portions to a source line driver;
   a source line coupled to the plurality of transmit portions through the plurality of contact portions; and
   a connection portion, configured to connect the plurality of transmit portions and couple the plurality of transmit portions to the plurality of contact portions, the connection portion being different from the plurality of contact portions;
   wherein, in a layout view, the plurality of transmit portions extend along a first direction, the connection portion extends along a second direction traverse to the first direction, and the connection portion surrounds the plurality of contact portions;
   wherein resistances between the plurality of transmit portions and the source line driver are substantially the same.

15. The device of claim 14, further comprising:
   a plurality of bit lines coupled to the plurality of transmit portions, respectively, and configured to transmit the bit line signals through the plurality of transmit portions and the plurality of contact portions to the source line driver, respectively.

16. The device of claim 15, wherein the source line is coupled between the plurality of contact portions and the source line driver; and
   wherein the plurality of contact portions are configured to transmit the bit line signals from the plurality of transmit portions through the source line to the source line driver.

17. The device of claim 14, wherein the plurality of contact portions are separate from each other or formed as a one contact.

18. The device of claim 14, wherein the plurality of transmit portions are disposed on a same layer.

19. The device of claim 14, wherein the plurality of contact portions are disposed on a same layer.

20. The device of claim 14, wherein
   the plurality of contact portions are separate from each other and disposed on a same layer, and
   the plurality of contact portions are coupled through the source line to the source line driver, and configured to transmit the bit line signals from the plurality of transmit portions through the source line to the source line driver.

\* \* \* \* \*